(12) United States Patent
Chen

(10) Patent No.: US 12,203,477 B1
(45) Date of Patent: Jan. 21, 2025

(54) ELECTRICAL FAN HAVING VARIOUS SUPPLIES OF ELECTRICITY

(71) Applicant: Yi-Te Chen, Taoyuan (TW)

(72) Inventor: Yi-Te Chen, Taoyuan (TW)

( * ) Notice: Subject to any disclaimer, the term of this patent is extended or adjusted under 35 U.S.C. 154(b) by 55 days.

(21) Appl. No.: 18/344,798

(22) Filed: Jun. 29, 2023

(51) Int. Cl.
| | |
|---|---|
| F04D 25/06 | (2006.01) |
| A42B 1/008 | (2021.01) |
| A42B 3/28 | (2006.01) |
| F04D 13/06 | (2006.01) |
| F04D 19/00 | (2006.01) |
| F04D 25/08 | (2006.01) |
| F04D 29/42 | (2006.01) |
| F04D 29/52 | (2006.01) |
| F04D 29/60 | (2006.01) |
| F04D 29/64 | (2006.01) |
| H02J 7/00 | (2006.01) |
| H05K 7/14 | (2006.01) |

(52) U.S. Cl.
CPC .......... *F04D 25/0673* (2013.01); *A42B 1/008* (2013.01); *A42B 3/286* (2013.01); *F04D 13/068* (2013.01); *F04D 19/002* (2013.01); *F04D 25/08* (2013.01); *F04D 25/084* (2013.01); *F04D 29/4226* (2013.01); *F04D 29/522* (2013.01); *F04D 29/601* (2013.01); *F04D 29/646* (2013.01); *H02J 7/0063* (2013.01); *H05K 7/1427* (2013.01)

(58) Field of Classification Search
CPC .... F04D 25/0673; F04D 25/08; F04D 25/084; F04D 29/601; F04D 29/646; F04D 29/4226; F04D 29/522; F04D 19/002; F04D 13/068; F04D 29/703; A42B 3/286; A42B 1/008; H02J 7/0063; H05K 7/1427
See application file for complete search history.

(56) References Cited

U.S. PATENT DOCUMENTS

| | | | |
|---|---|---|---|
| 11,445,775 B2 * | 9/2022 | Otey | F04D 17/16 |
| 2013/0094980 A1 * | 4/2013 | Chan | F04D 25/084 |
| | | | 417/423.1 |
| 2023/0390548 A1 * | 12/2023 | Allen | A61M 60/419 |

* cited by examiner

*Primary Examiner* — Peter J Bertheaud
(74) *Attorney, Agent, or Firm* — Leong C. Lei

(57) ABSTRACT

An electrical fan having various supplies of electricity includes: a housing; a motor securely fixed in an interior of the housing to generate rotating power; an impeller located in the interior of the housing and connected to the motor to be driven by the motor to rotate; a circuit board arranged in the interior of the housing and electrically connected with the motor and including a boost circuit; an electricity supply hole arranged on the housing and electrically connected with the circuit board to provide a USB-C power supply that is provided from outside; a dry battery box arranged in the housing and electrically connected with the circuit board to accommodate therein a plurality of dry batteries that provide a 9V dry-battery power supply; and a control switch arranged on the housing to serve as a user control interface.

8 Claims, 7 Drawing Sheets

ELECTRICAL FAN HAVING VARIOUS SUPPLIES OF ELECTRICITY

TECHNICAL FIELD OF THE INVENTION

The present invention relates generally to an electrical fan, and more particularly to an electrical fan having various supplies of electricity.

DESCRIPTION OF THE PRIOR ART

Electrical fans that are currently available can be divided into two groups that are respectively supplied with electricity from mains electricity and a rechargeable lithium battery. However, a user may bring an electrical fan outdoors, and in case that no wall socket of mains electricity is available or there is no way to recharge the lithium battery, the electrical fan is inoperable, such as during camping or power outage in a typhoon or earthquake, and this would cause unbearable discomfort for the user in extremely hot weather or environment.

Thus, it is a challenge of the manufacturers to provide a solution of various supplies of electricity for selection in case that no electricity supply is available from mains electricity or a rechargeable lithium battery.

SUMMARY OF THE INVENTION

In view of the above, to improve the drawback of the prior art that the known electrical fan will not be operable if there is no mains electricity socket available or charging of a lithium battery is not available for the electrical fan, the present invention provides an electrical fan having various supplies of electricity, comprising: a housing; a motor securely fixed in an interior of the housing to generate rotating power; an impeller located in the interior of the housing and connected to the motor to be driven by the motor to rotate; a circuit board arranged in the interior of the housing and electrically connected with the motor and including a boost circuit; an electricity supply hole arranged on the housing and electrically connected with the circuit board to provide a USB-C power supply that is provided from outside; a dry battery box arranged in the housing and electrically connected with the circuit board to accommodate therein a plurality of dry batteries that provide a 9V dry-battery power supply; and a control switch arranged on the housing to serve as a user control interface, wherein a sequence of priority of supply from the circuit board to the motor is that the USB-C power supply has priority over the 9V dry-battery power supply, and electrical power supplied from the USB-C power supply is first subjected to voltage boosting by means of the boost circuit. The present invention provides various ways of electricity supply, which allows the present invention to be used in different environment to thereby greatly expand the applicability and range of use of the present invention.

DETAILED DESCRIPTION OF THE PREFERRED EMBODIMENT

Figure 1:
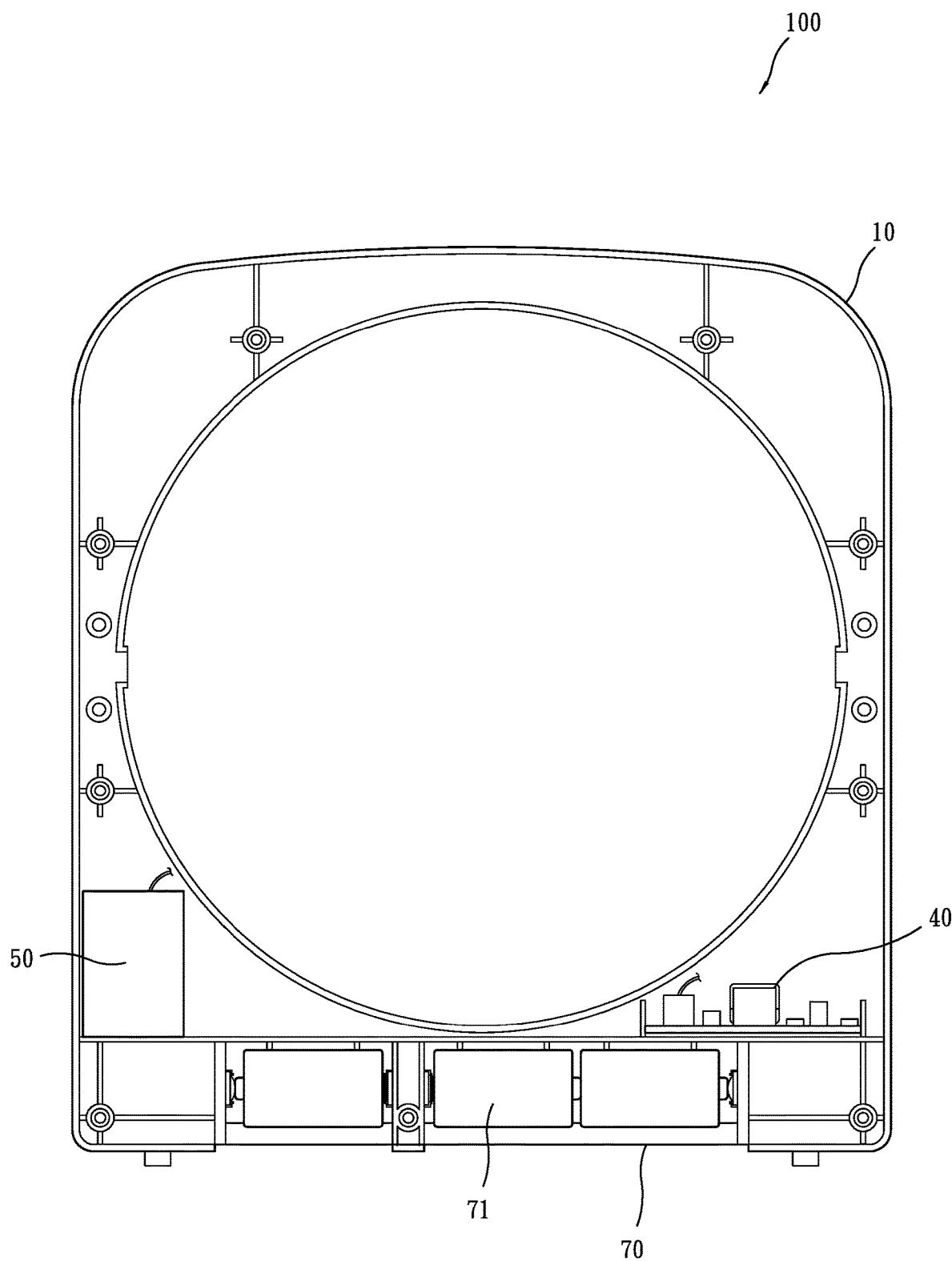
FIG. 1 is a schematic view showing an internal structure of a preferred embodiment of the present invention.

Referring to FIGS. 1-7, the present invention provides, in a preferred embodiment, an electrical fan 100 having various supplies of electricity, which mainly comprises a housing 10, a motor 20, an impeller 30, a circuit board 40, a lithium battery 50, an electricity supply hole 60, a dry battery box 70, and a control switch 80.

Referring to FIGS. 1-5, the housing 10 is stably positionable on the ground or a flat surface.

Figure 4:
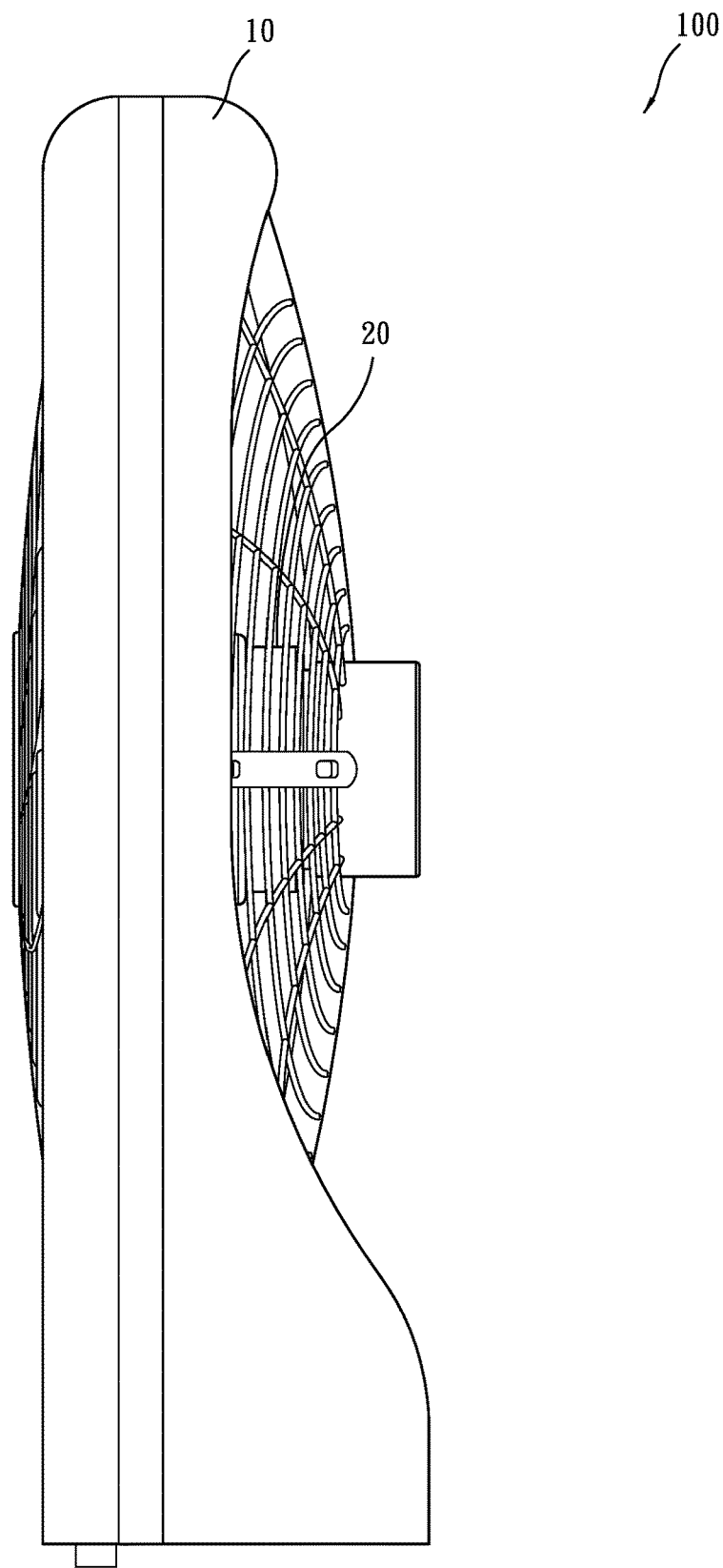
FIG. 4 is a side elevational view of the embodiment shown in FIG. 1.

Referring to FIG. 4, the motor 20 is securely arranged in the housing 10 to generate rotating power.

Figure 2:
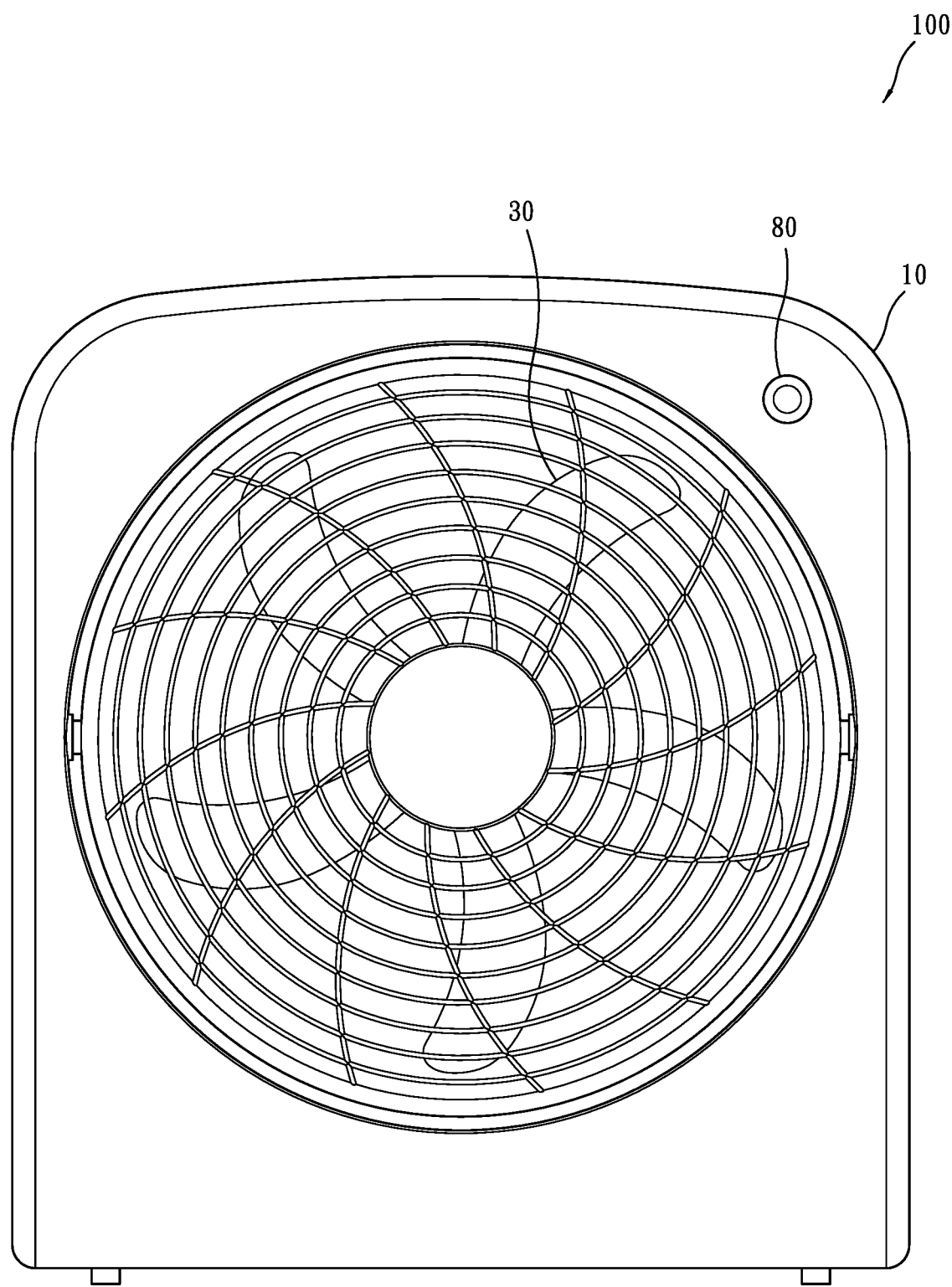
FIG. 2 is a front view of the embodiment shown in FIG. 1.
Figure 3:
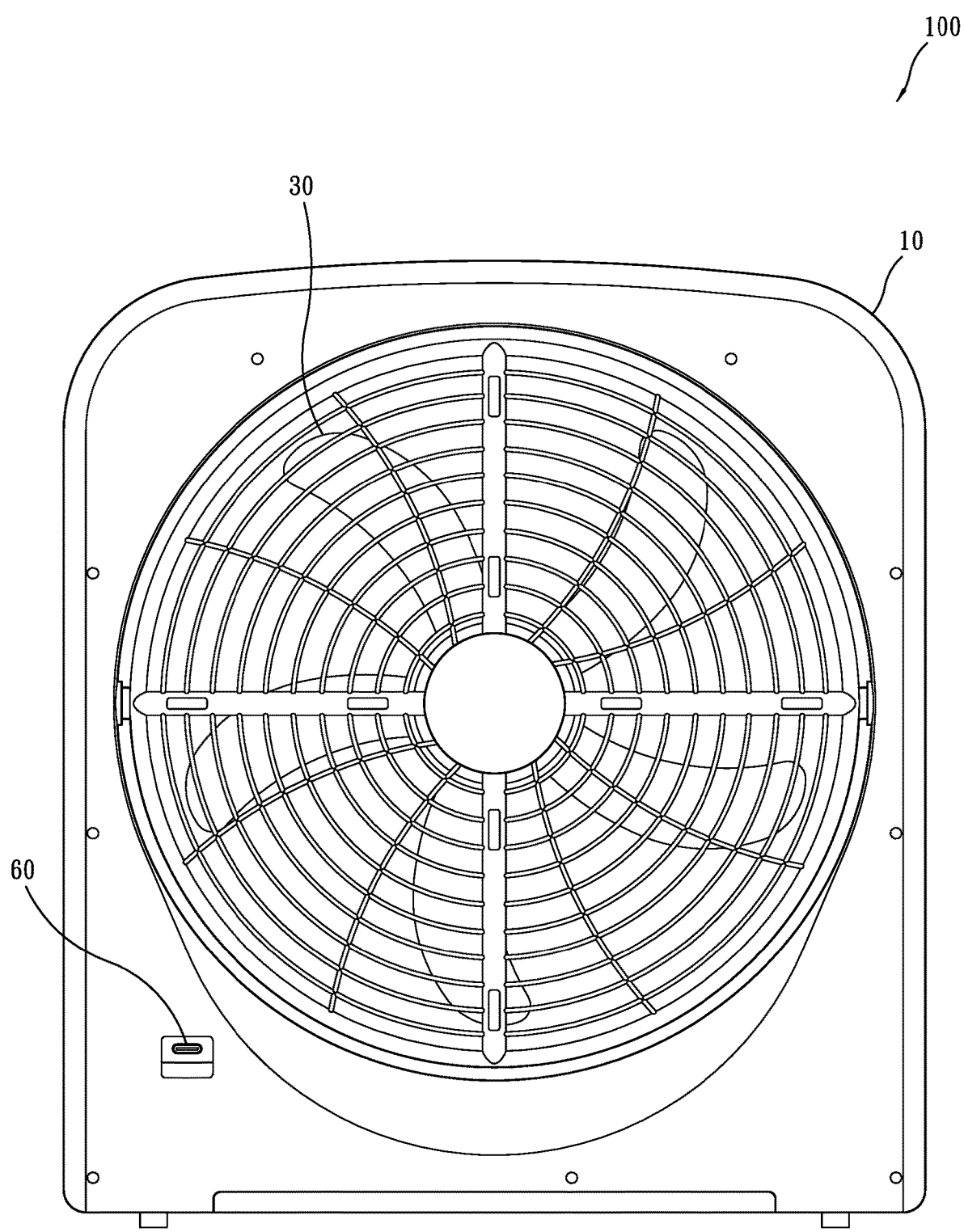
FIG. 3 is a rear view of the embodiment shown in FIG. 1.

Referring to FIGS. 2 and 3, the impeller 30 is located in an interior of the housing 10 and is connected to the motor 20 to be driven by the motor 20 to rotate.

Figure 6:
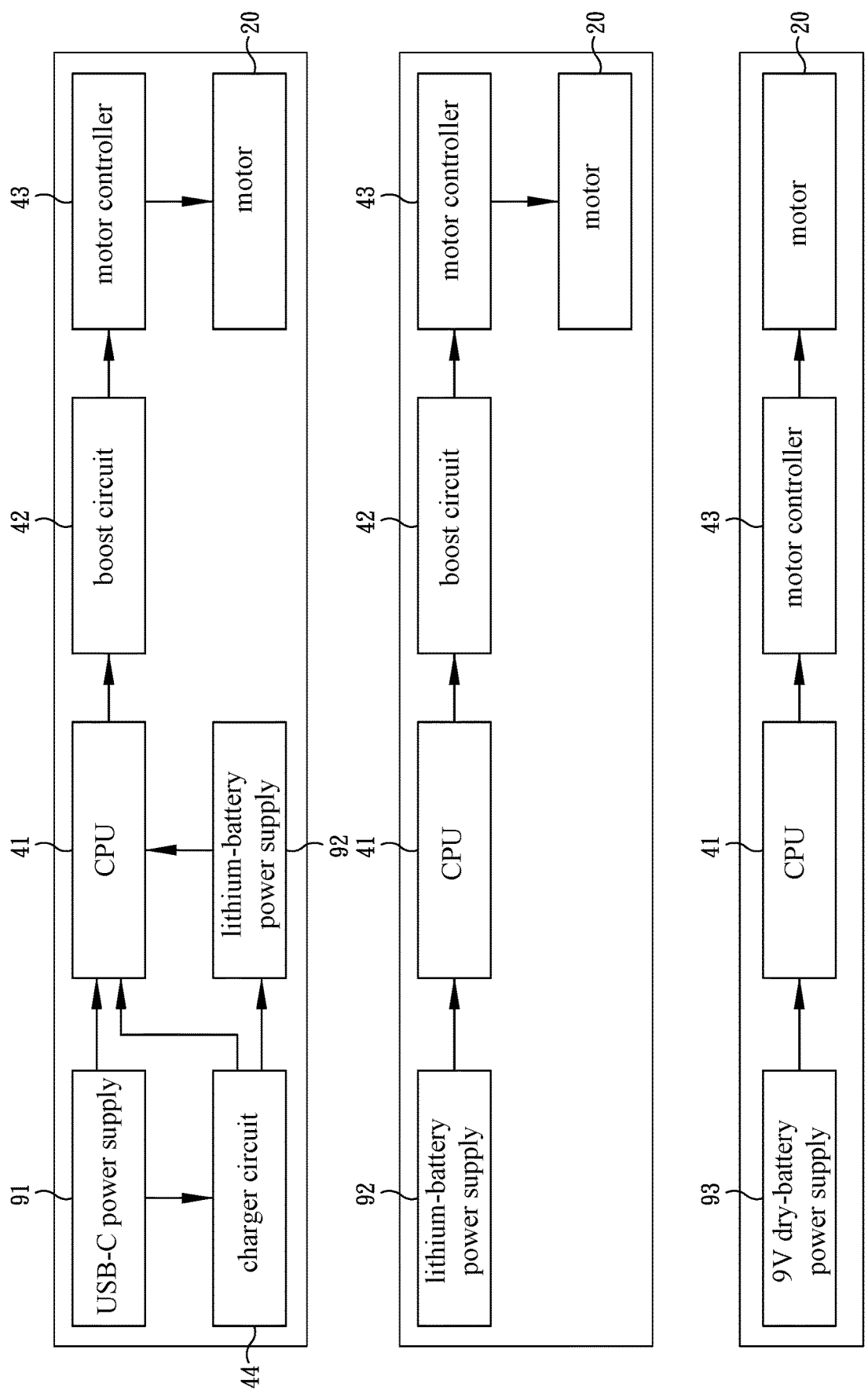
FIG. 6 is a chart showing a flow of supply of electricity for the embodiment of FIG. 1.

Referring to FIGS. 1 and 6, the circuit board 40 is arranged in the interior of the housing 10 and is electrically connected with the motor 20. The circuit board 40 comprises a central processing unit (CPU) 41, a boost circuit 42, a motor controller 43, a charger circuit 44, and a power source identification circuit 45.

Referring to FIG. 1, the lithium battery 50 is arranged in the interior of the housing 10 and is electrically connected with the circuit board 40 to store electrical power therein.

Referring to FIG. 3, the electricity supply hole 60 is arranged on a back of the housing 10 and is electrically connected with the circuit board 40. In the instant embodiment, the electricity supply hole 60 is a Type-C electricity supply hole.

Figure 5:
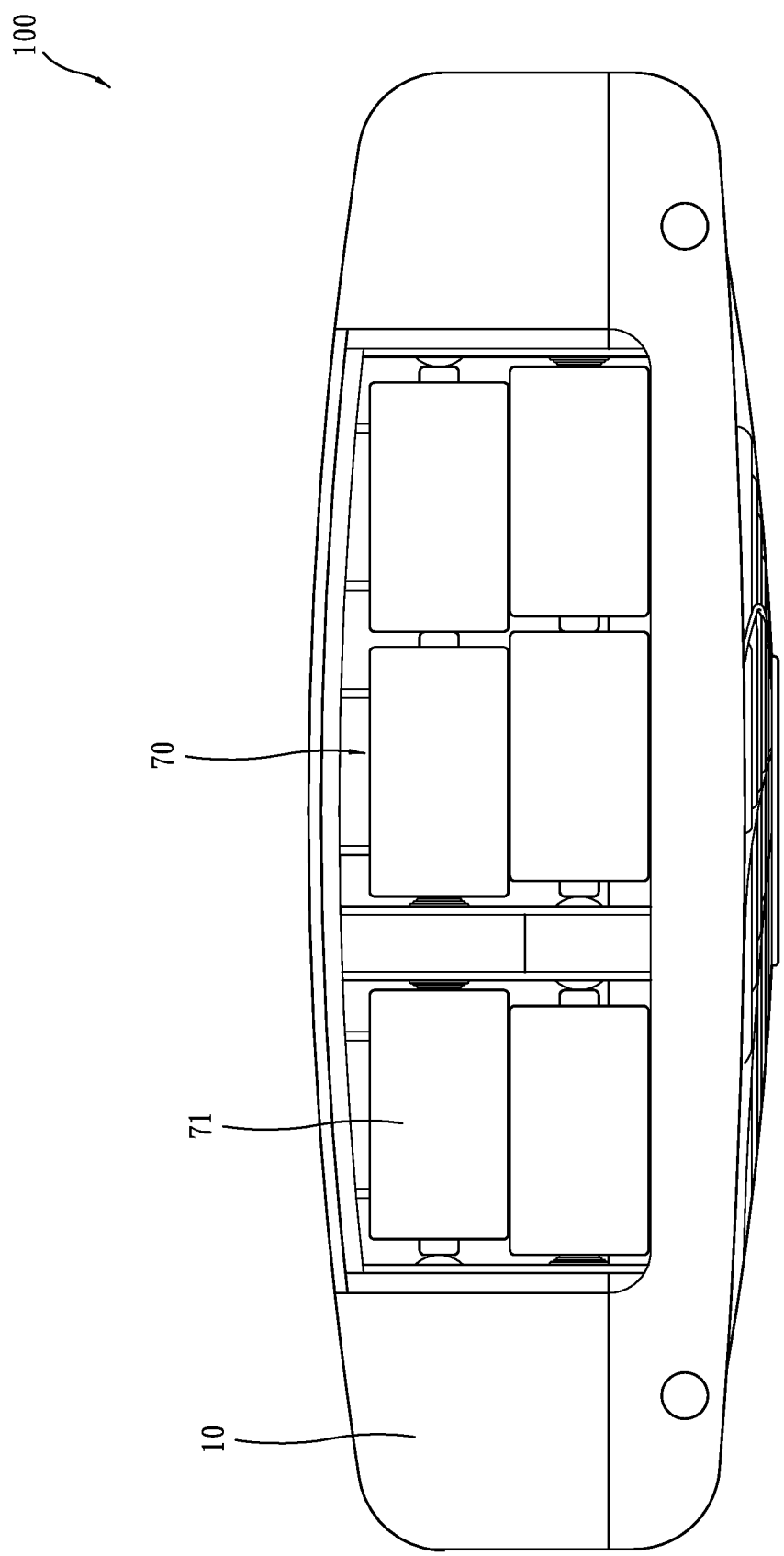
FIG. 5 is a bottom view of the embodiment shown in FIG. 1.

Referring to FIGS. 1 and 5, the dry battery box 70 is arranged in the interior of the housing 10 and is electrically connected with the circuit board 40, wherein the battery box 70 includes a cover (not shown), which is openable to allow for deposition or removal of a plurality of dry batteries 71 therein or therefrom.

Referring to FIG. 2, the control switch 80 is arranged on a front surface of the housing 10 and is electrically connected with the circuit board 40 to serve as an interface for a user to operate the present invention.

Thus, the above provides a description to various components of the electrical fan 100 having various supplies of electricity according to the preferred embodiment of the present invention, and the way of assembly thereof, and in the following, the operation thereof will be described.

Firstly, as shown in FIG. 6, an external USB-C power supply 91 (which refers to electrical power fed in through a USB-C charging line), when supplied through the electricity supply hole 60 to the CPU 41 of the circuit board 40, is voltage-boosted through the boost circuit 42 to be then fed to the motor controller 43 to supply electrical power to the motor 20 to cause the motor 20 to generate rotating power for driving the impeller 30 to rotate thereby achieving an effect of generation of airflow or wind. Next, when the external USB-C power supply 91 is fed in, if, at this moment, the control switch 80 is not set ON, the USB-C power supply 91 so fed in is directed through the charger circuit 44 to get into the lithium battery 50 for carrying out electrical charging.

Next, as shown in FIG. 6, when the lithium battery 50 is set to provide lithium-battery power supply 92, the electrical power from the lithium battery 50 is supplied through the CPU 41 to the boost circuit 42 for voltage boosting and then fed to the motor controller 43, so as to supply electrical power to the motor 20 to cause the motor 20 to generate rotating power for driving the impeller 30 to rotate thereby achieving an effect of generation of airflow or wind.

Finally, as shown in FIG. 6, when the dry batteries 71 contained in the dry battery box 70 are set to provide 9V dry-battery power supply 93, the CPU directly feeds the electrical power to the motor controller 43 to supply electrical power to the motor 20 to cause the motor 20 to generate rotating power for driving the impeller 30 to rotate thereby achieving an effect of generation of airflow or wind.

Figure 7:
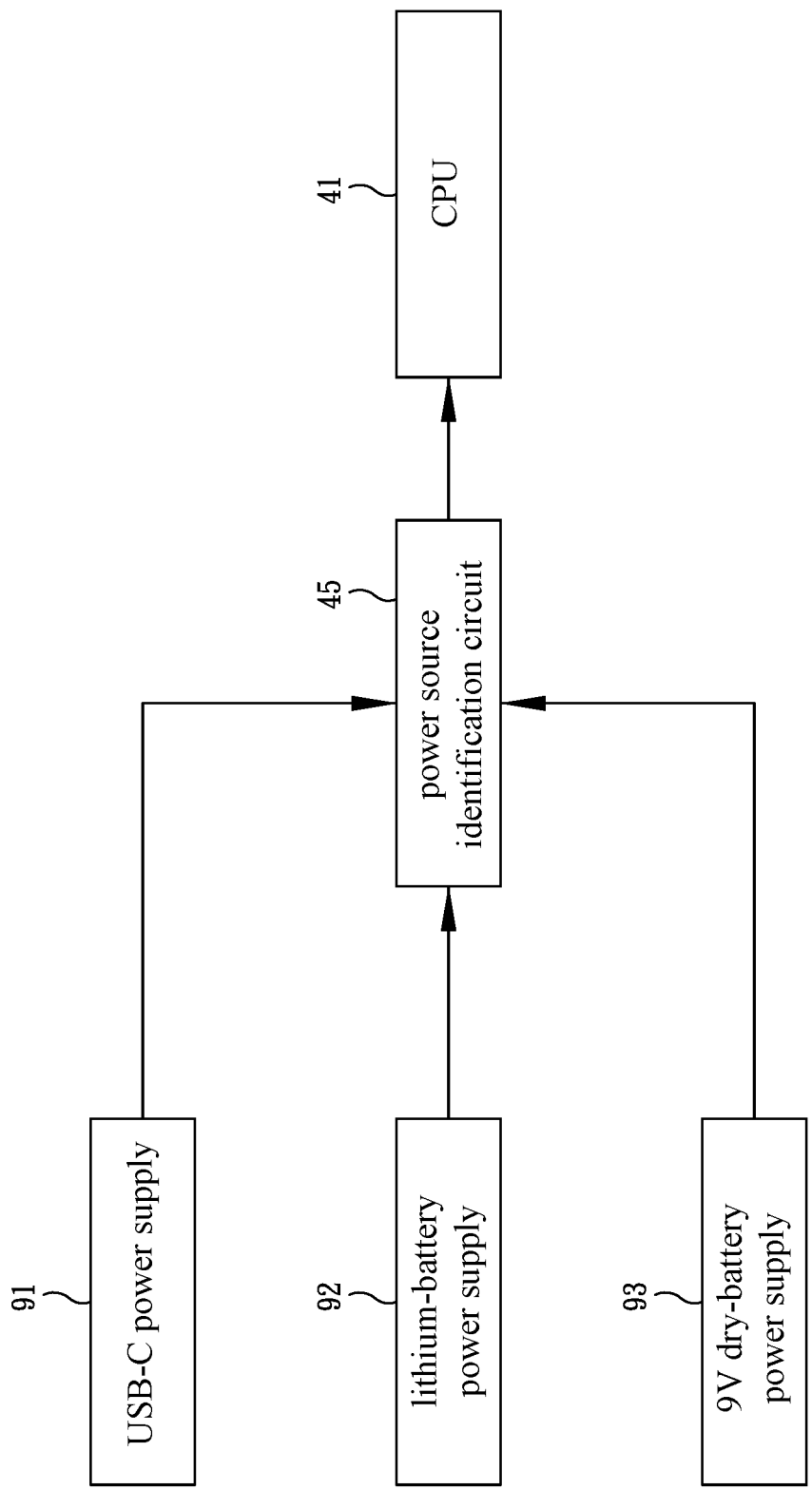
FIG. 7 is a chart showing a sequence of supply of electricity for the embodiment of FIG. 1.

Further, in the present invention, the circuit board 40 is provided with the power source identification circuit 45, and as shown in FIG. 7, either one of the USB-C power supply 91, the lithium-battery power supply 92, and the 9V dry-battery power supply 93 is first identified by the power source identification circuit 45 before being fed to the CPU 41, and a sequence of priority of use as being so identified is the USB-C power supply 91, the lithium-battery power supply 92, and the 9V dry-battery power supply 93.

Thus, the present invention provides three options of electricity supplies, and this allows a user to select in different environments, so that a range of application is greatly expanded, and the trouble of no availability of operation can be avoided.

I claim:

1. An electrical fan having various supplies of electricity, comprising:
   a housing;
   a motor, which is fixed in an interior of the housing to generate rotating power;
   an impeller, which is located in the interior of the housing and is connected to the motor to be driven by the motor to rotate;
   a circuit board, which is arranged in the interior of the housing and is electrically connected with the motor, and comprises a boost circuit;
   an electricity supply hole, which is arranged on the housing and is electrically connected with the circuit board to provide a USB-C power supply that is provided from outside;
   a dry battery box, which is arranged in the housing and is electrically connected with the circuit board to accommodate therein a plurality of dry batteries that provide a 9V dry-battery power supply; and
   a control switch, which is arranged on the housing to serve as a user control interface;
   wherein a sequence of priority of supply from the circuit board to the motor is that the USB-C power supply has priority over the 9V dry-battery power supply, and electrical power supplied from the USB-C power supply is first subjected to voltage boosting by means of the boost circuit.

2. The electrical fan having various supplies of electricity according to claim 1, further comprising at least one lithium battery, which is arranged in the interior of the housing and is electrically connected with the circuit board to provide a lithium-battery power supply; and the sequence of priority of supply from the circuit board to the motor is that the USB-C power supply is of a top priority; the lithium-battery power supply is of a second priority; and the 9V dry-battery power supply is of the lowest priority, and electrical power supplied from the lithium-battery power supply is first subjected to voltage boosting by means of the boost circuit.

3. The electrical fan having various supplies of electricity according to claim 2, wherein when the control switch is turned ON or OFF, the USB-C power supply charges the lithium battery.

4. The electrical fan having various supplies of electricity according to claim 1, wherein the electricity supply hole is a type-C electricity supply hole.

5. The electrical fan having various supplies of electricity according to claim 1, wherein the battery box comprises a cover, which is openable for deposition or removal of the dry batteries therein or therefrom.

6. The electrical fan having various supplies of electricity according to claim 1, wherein the circuit board comprises a central processing unit (CPU), the boost circuit, a motor controller, a power source identification circuit, and a charger circuit; and identification is implemented by the power source identification circuit that the USB-C power supply is being fed through the electricity supply hole and is supplied to the CPU of the circuit board to be subjected to voltage boosting by the boost circuit to be then fed to the motor controller, in order to supply electrical power to the motor to cause the motor to generate rotating power for driving the impeller to rotate; and when the control switch is turned ON or OFF, the USB-C power supply so fed is supplied through the charger circuit into the lithium battery for charging.

7. The electrical fan having various supplies of electricity according to claim 1, wherein the circuit board comprises a central processing unit (CPU), the boost circuit, a motor controller, a power source identification circuit, and a charger circuit; and identification is implemented by the power source identification circuit that the lithium-battery power supply is being provided by the lithium battery and is supplied through the CPU to be subjected to voltage boosting by the boost circuit to be then fed to the motor controller, in order to supply electrical power to the motor to cause the motor to generate rotating power for driving the impeller to rotate.

8. The electrical fan having various supplies of electricity according to claim 1, wherein the circuit board comprises a central processing unit (CPU), the boost circuit, a motor controller, a power source identification circuit, and a charger circuit; and identification is implemented by the power source identification circuit that the 9V dry-battery power supply is being provided by the dry battery box, the CPU directly transits electrical power to the motor controller, in order to supply electrical power to the motor to cause the motor to generate rotating power for driving the impeller to rotate.

\* \* \* \* \*